(12) United States Patent
Wang

(10) Patent No.: US 11,270,998 B2
(45) Date of Patent: Mar. 8, 2022

(54) EMBEDDED MEMORY IN THREE-DIMENSIONAL INTEGRATED CIRCUIT

(71) Applicant: Intel Corporation, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 15/943,537

(22) Filed: Apr. 2, 2018

(65) Prior Publication Data

US 2019/0304978 A1 Oct. 3, 2019

(51) Int. Cl.
*G11C 11/404* (2006.01)
*H01L 27/108* (2006.01)
*G11C 11/408* (2006.01)
*G11C 11/4091* (2006.01)
*H01L 27/06* (2006.01)

(52) U.S. Cl.
CPC ...... *H01L 27/10802* (2013.01); *G11C 11/404* (2013.01); *H01L 27/10855* (2013.01); *H01L 27/10873* (2013.01); *H01L 27/10891* (2013.01); *H01L 27/10897* (2013.01); *G11C 11/4085* (2013.01); *G11C 11/4091* (2013.01); *H01L 27/0694* (2013.01)

(58) Field of Classification Search
CPC .................. G11C 11/404; G11C 11/4045; H01L 27/0694
USPC ..................... 365/63, 51, 130, 149
See application file for complete search history.

(56) References Cited

U.S. PATENT DOCUMENTS

2020/0220024 A1\* 7/2020 Sharma ................. H01L 29/792
2020/0357929 A1\* 11/2020 Le ......................... H01L 45/141
2020/0373312 A1\* 11/2020 Sharma ............ H01L 27/11507

\* cited by examiner

*Primary Examiner* — Alfredo Bermudez Lozada
(74) *Attorney, Agent, or Firm* — Schwabe, Williamson & Wyatt, P.C.

(57) ABSTRACT

Described herein are apparatuses, methods, and systems associated with a memory circuit in a three-dimensional (3D) integrated circuit (IC). A control circuit of the memory circuit may include logic transistors in a logic layer of the 3D IC. The control circuit may further include one or more interconnects (e.g., local or global interconnects) and/or other devices in one or more front-side metal layers of the 3D IC. The memory circuit may further include a memory array in back-side metal layers of the 3D IC. The memory array may be formed in the back-side metal layers that are closest to the logic layer. Other embodiments may be described and claimed.

22 Claims, 10 Drawing Sheets

EMBEDDED MEMORY IN THREE-DIMENSIONAL INTEGRATED CIRCUIT

TECHNICAL FIELD

Embodiments of the disclosure are in the field of integrated circuits and, in particular, to embedded memory in three-dimensional integrated circuits.

BACKGROUND

Dynamic random access memory (DRAM) that is included on the same integrated circuit (IC) die as logic circuitry (e.g., logic transistors, such as a processor) is referred to as embedded DRAM (eDRAM). eDRAM circuits include an array of eDRAM cells and a control circuit (e.g., for performing memory operations, such as read and/or write operations). In some integrated circuits, a portion or all of the individual eDRAM cells are included in metal layers of the integrated circuit above the logic transistors.

DESCRIPTION OF THE EMBODIMENTS

Figure 1:
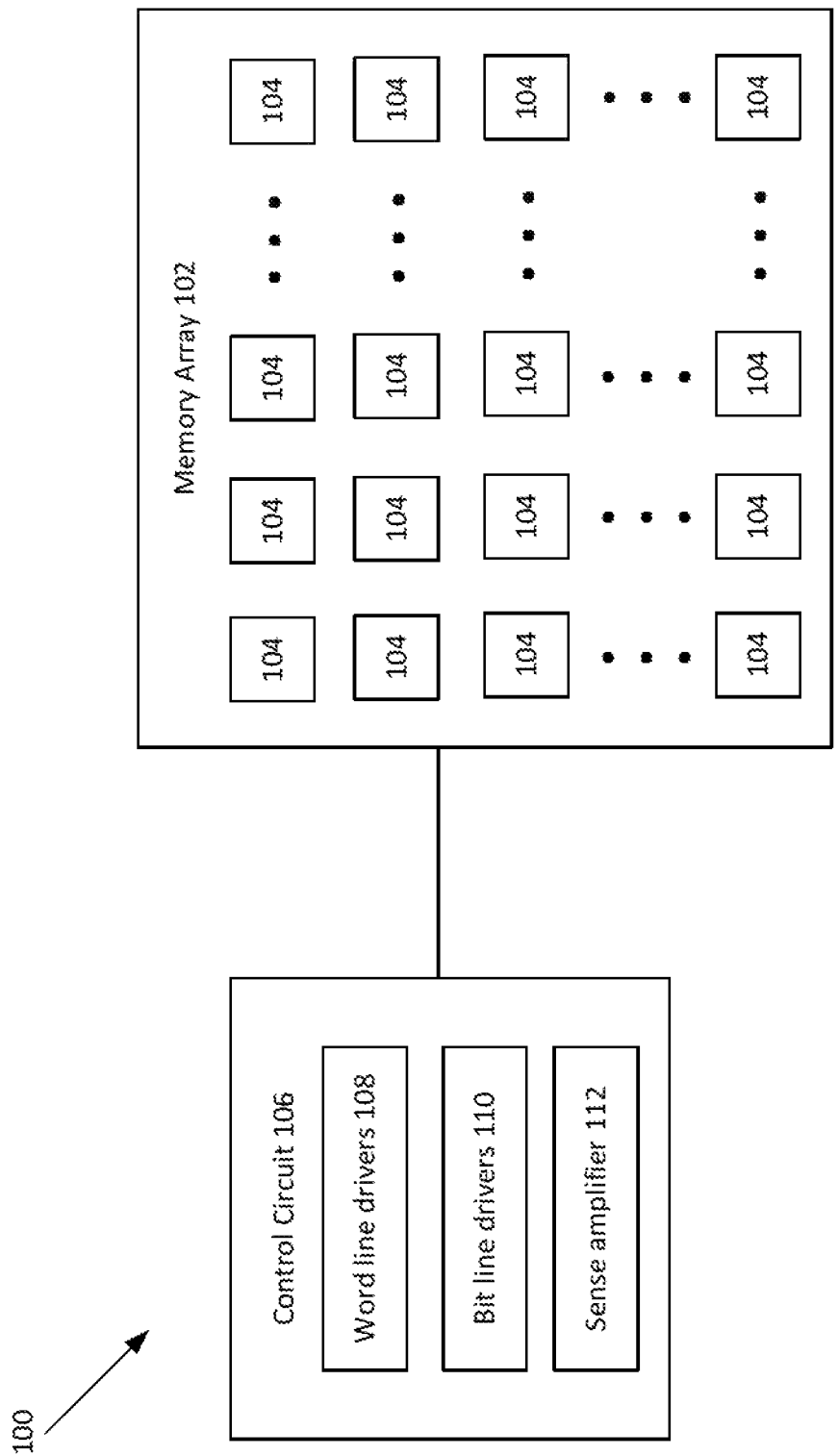
FIG. 1 schematically illustrates a memory circuit in accordance with various embodiments.

Described herein are techniques for embedded memory in three-dimensional (3D) integrated circuits (ICs), and associated methods, apparatuses, and systems. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only nonplanar transistors, it should be noted that the disclosure may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Various embodiments described herein are directed to techniques for embedded memory in a 3D IC. In various embodiments, the 3D IC may include a logic layer that includes logic transistors. The 3D IC may further include front-side metal layers on a front side of the 3D IC (e.g., above the substrate on which the logic transistors are formed) and back-side metal layers on a back side of the 3D IC. (e.g., below the substrate on which the logic transistors are formed). In some embodiments, the substrate may be partially or completely removed after formation of the logic transistors.

In various embodiments, the memory circuit of the 3D IC may include a memory array of memory cells and a control circuit coupled to the memory array to control the memory array. The control circuit may include logic transistors in the logic layer of the 3D IC. The control circuit may further include one or more interconnects (e.g., local or global interconnects) and/or other devices in one or more front-side metal layers of the 3D IC. The memory array may be in the back-side metal layers of the 3D IC (e.g., in the back-side metal layers that are closest to the logic layer). For example, word lines of the memory array may be formed in back-side metal layer M-1 that is closest to the logic layer. Selector transistors (e.g., thin-film transistors (TFTs)) of the individual memory cells of the memory array may be partially or fully in metal layer M-2 that is adjacent to back-side metal layer M-1. In some embodiments, the bit lines of the memory array may also be formed in the back-side metal layer M-2. The storage devices (e.g., capacitors) of the individual memory cells may be in lower back-side metal layers (e.g., back-side metal layers M-3 and/or M-4). Other embodiments may be described and claimed.

FIG. 1 illustrates a memory circuit 100 in accordance with various embodiments. The memory circuit 100 may be an eDRAM memory circuit in some embodiments. The memory circuit 100 may include a memory array 102 including a plurality of memory cells 104. The memory cells 104 may be arranged in rows and columns, with memory cells 104 of the same column coupled to the same word line, and memory cells 104 of the same row coupled to the same bit line. Alternatively, memory cells 104 of the same column may be coupled to the same word line and memory cells 104 of the same row may be coupled to the same bit line.

In various embodiments, the memory circuit 100 may further include a control circuit 106. The control circuit 106 may include word line drivers 108 to generate and/or provide a word line signal to respective word lines of the memory array 102 to perform one or more operations, such as a write operation, a read operation, a refresh operation, and/or an erase operation. The control circuit 106 may further include bit line drivers 110 to generate and/or provide a bit line signal to respective bit lines of the memory array 102 (e.g., during a write operation). The control circuit 106 may further include one or more sense amplifiers 112 to determine a value of data stored by one or more memory cells 104 (e.g., during a read operation).

In various embodiments, the memory array 102 (e.g., the memory cells 104, word lines, and/or bit lines) may be formed in one or more metal layers on one side (e.g., the back side) of a logic layer in a 3D IC. For example, the memory cells 104 may include a selector transistor (e.g., a TFT), and a storage device (e.g., a capacitor) formed in the backside metal layers. The control circuit 106 may be implemented by transistors in the logic layer of the 3D IC. Additionally, metal layers on the other side of the logic layer from the memory cells 104 (e.g., on the front side) may include interconnects (e.g., trenches and/or vias) to conductively couple different devices of the control circuit 106 and/or to conductively couple the control circuit 106 to another circuit in the logic layer of the 3D IC (e.g., one or more processor cores on the 3D IC).

In various embodiments, having the memory cells 104 on the opposite side of the logic layer from the interconnects used to route signals within the control circuit 106 and/or between the control circuit 106 and another circuit of the 3D IC may enable the memory cells 104 to be located closer to the logic layer than was possible with prior designs of eDRAM.

Figure 2:
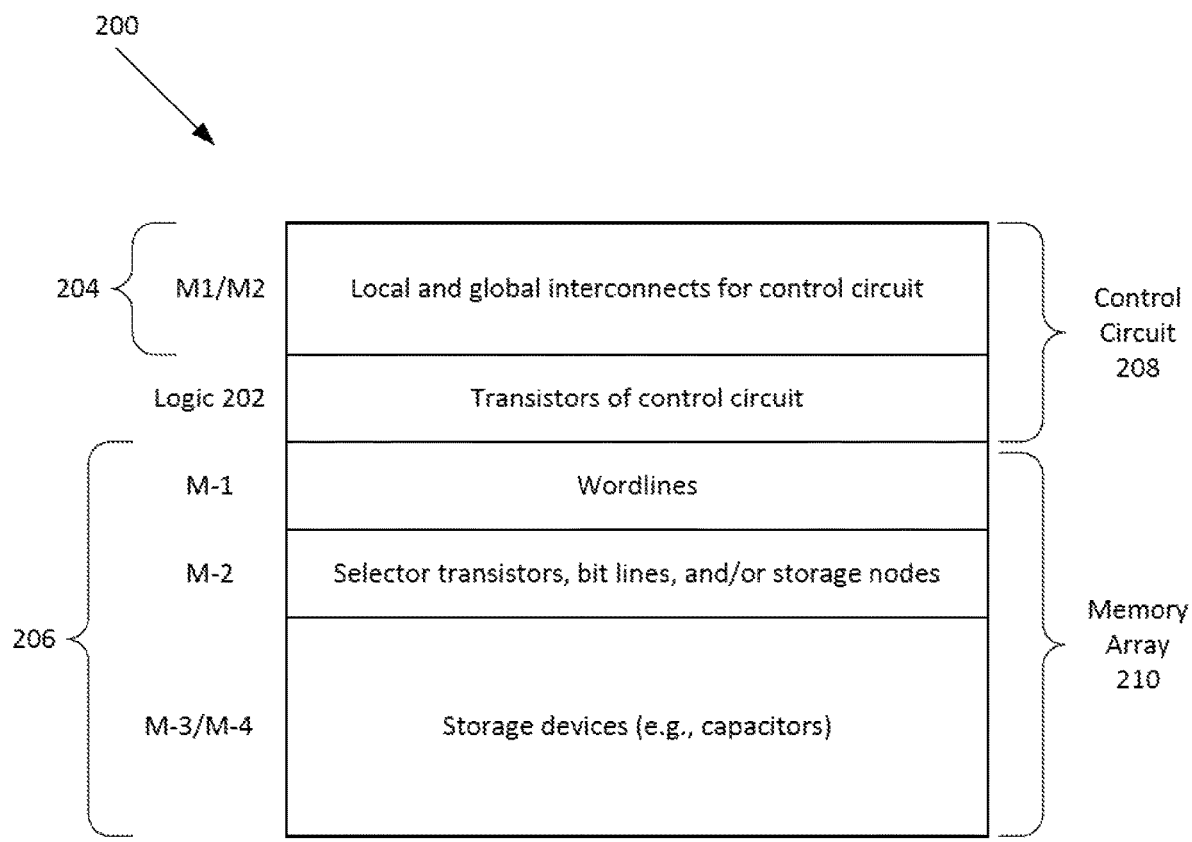
FIG. 2 schematically illustrates circuitry layers of a memory circuit, in accordance with various embodiments.

For example, FIG. 2 illustrates a memory circuit 200 implemented in a stack of layers including a logic layer 202, front-side metal layers 204, and/or back-side metal layers 206. As shown, the control circuit 208 may be implemented in the logic layer 202 and front-side metal layers 204, and the memory array 210 may be implemented in the back-side metal layers 206. In some embodiments, the memory array 210 may be implemented in the back-side metal layers 206 closest to the logic layer 202. For example, the word lines may be disposed in metal layer M-1 (the back-side metal layer that is closest to the logic layer). Metal layer M-2 (the back-side metal layer immediately below metal layer M-1) may include the selector transistors, bit lines, and/or storage nodes of the memory array. The storage devices (e.g., capacitors) may be in one or more back-side metal layers below metal layer M-2 (e.g., metal layers M-3 and/or M-4). In some embodiments, the storage devices may include metal-insulator-metal (MIM) capacitors.

In various embodiments, the memory circuit 200 may enable shorter and/or simpler routing of electrical signals between the control circuit 208 and the memory array 210. Additionally, the back-side metal layers 206 of the 3D IC may be specifically designed to accommodate the memory array 210 of the memory circuit 200. For example, one or more of the back-side metal layers 206 may be thicker and/or have a greater pitch than corresponding front-side metal layers 204. The back-side metal layers 206 with a greater thickness and/or pitch may improve performance and/or simplify manufacturing of the memory array 210.

Furthermore, since the memory array 210 is in the back-side metal layers 206, the configuration of the front-side metal layers 204 (e.g., the thickness and/or pitch) may not need to be adjusted for inclusion of a memory array. Accordingly, the same design of the front-side metal layers for other parts of the 3D IC (e.g., the processor core) may be used for both ICs that include the memory array 210 and for ICs that do not include the memory array 210.

Figure 3A:
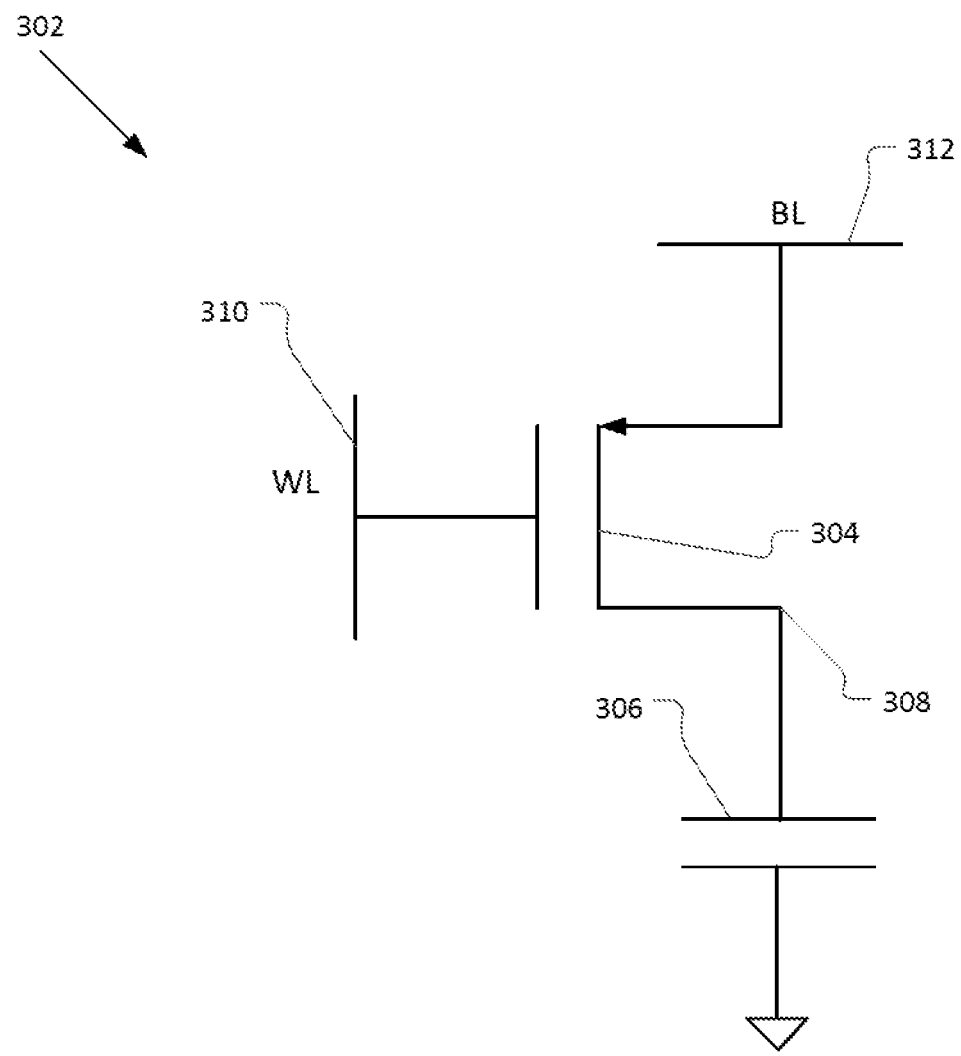
FIG. 3A schematically illustrates a memory cell in accordance with various embodiments.

FIG. 3A illustrates one example of a memory cell 302 in accordance with various embodiments. The memory cell 302 may include a selector transistor 304 and a capacitor 306. The selector transistor 304 may have a source terminal coupled to the capacitor 306 at a storage node 308, a gate terminal coupled to a word line 310 to receive a word line signal, and a drain terminal coupled to a bit line 312 to receive a bit line signal.

During a write operation to write data to the memory cell 302, the word line signal turns on the selector transistor 304, and the logic state of the bit line signal is written to the storage node 308 (and maintained there by the capacitor 306). During a read operation to read the data from the memory cell 302, the word line signal again turns on the selector transistor 304, and the logic state of the storage node 308 is passed to the bit line 312, where it can be determined by the control circuit (e.g., by a sense amplifier).

Figure 3B:
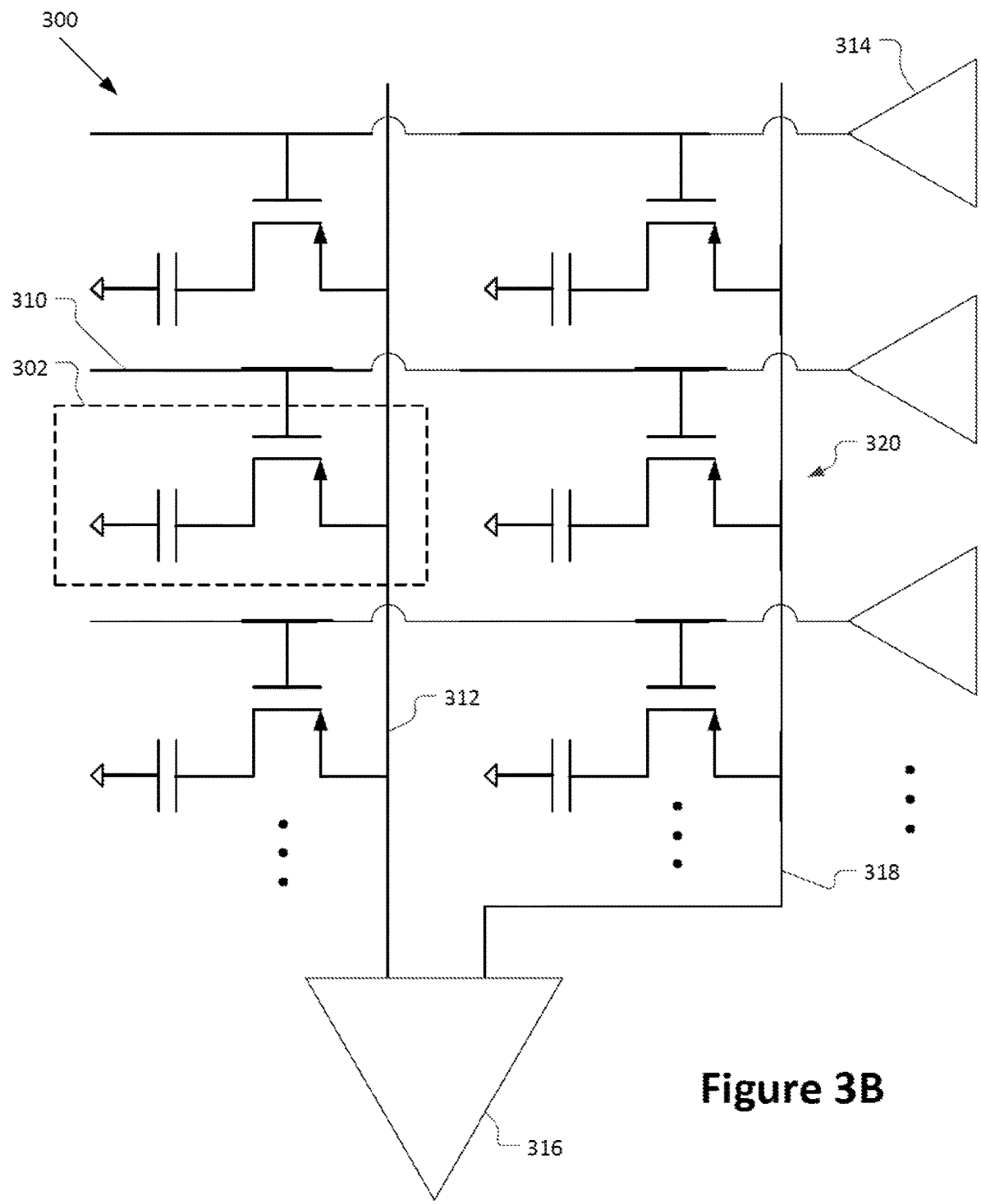
FIG. 3B schematically illustrates a memory circuit that includes a plurality of the memory cells of FIG. 3A, in accordance with various embodiments.

FIG. 3B illustrates one example of a memory circuit 300 that includes a plurality of memory cells 302 in accordance with various embodiments. The memory circuit 300 may correspond to the memory circuit 100 and/or 200 in some embodiments. The memory circuit 300 may include an array of memory cells 302 coupled to one another by respective word lines 310 and bit lines 312.

The memory circuit 300 may further include word line drivers 314 and a sense amplifier 316. The word line drivers 314 and/or sense amplifier 316 may be included in a control circuit of the memory circuit 300 (e.g., corresponding to the control circuit 106). Accordingly, the word line drivers 314 and/or sense amplifier 316 may include transistors in the logic layer of a 3D IC.

The word line drivers 314 may be coupled to respective word lines 310 to provide the word line signals on the respective word lines 310. The sense amplifier 316 may be coupled to the bit line 312 to determine the value of data stored by a selected memory cell 302 that is coupled to the bit line 312. For example, the sense amplifier 316 may compare the bit line signal on the bit line 312 with a reference signal on a reference bit line 318. In some embodiments, the reference signal may be provided by one or more reference bit cells 320 coupled to the reference bit line 318, as shown in FIG. 3B. It will be apparent that another reference signal and/or configuration of the memory circuit 300 may be used in other embodiments.

Figure 4A:
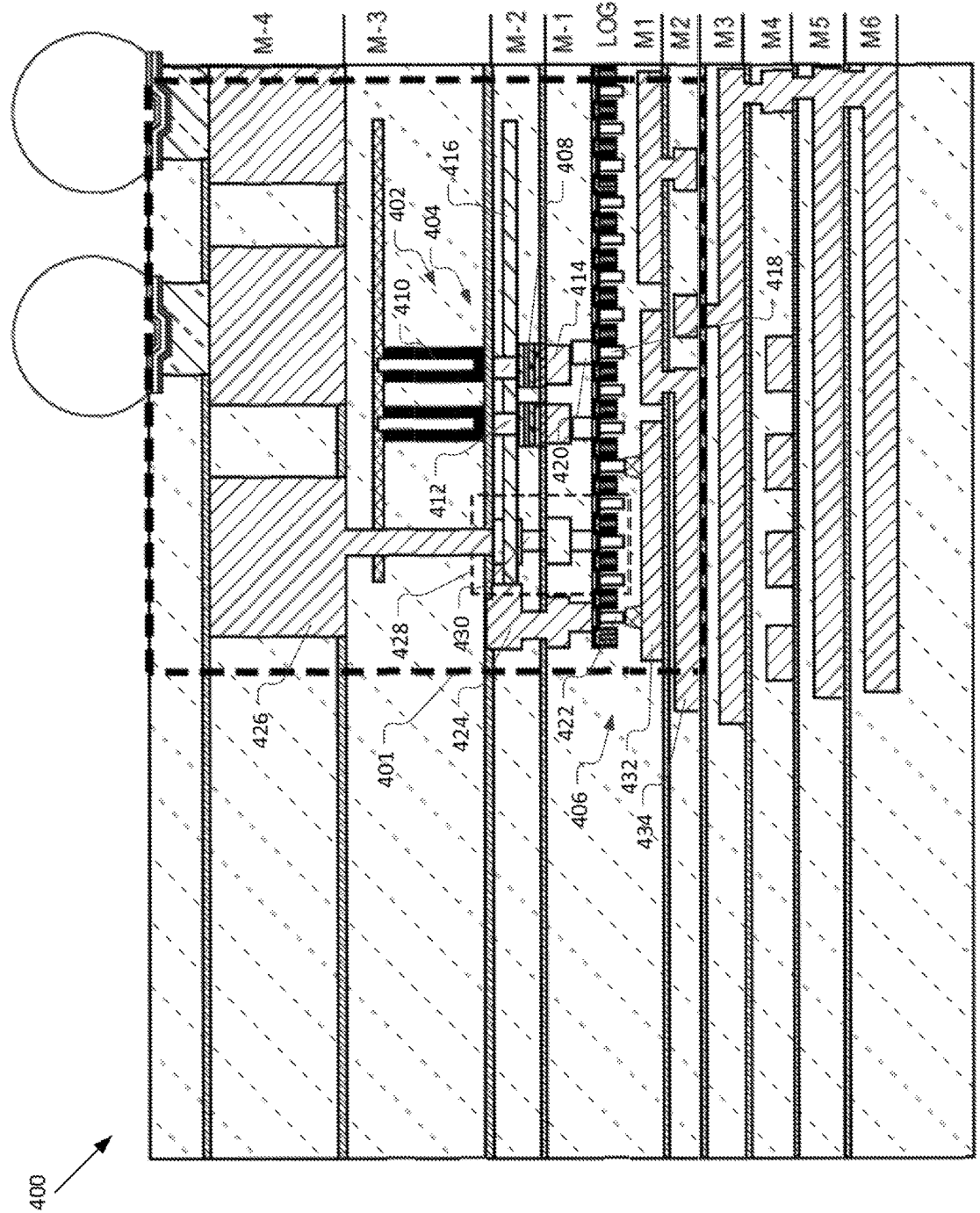
FIG. 4A is a side cross-sectional view of a three-dimensional (3D) integrated circuit (IC) including a memory circuit in accordance with various embodiments.

FIG. 4 illustrates a cross-sectional side view of one example of a 3D IC 400 including a memory circuit 401, in accordance with various embodiments. The memory circuit 401 may include a memory array 402 formed in the backside metal layers (e.g., metal layers M-1, M-2, M-3, and M-4) of the 3D IC 400, and a control circuit 406 that includes transistors in the logic layer of the 3D IC 400. The control circuit 406 may further include interconnects and/or other devices in front side metal layers (e.g., front side metal layers M1 and M2).

The memory array 402 may include a plurality of memory cells 404, with individual memory cells 404 including a selector transistor 408 (e.g., TFT) and a capacitor 410 (e.g., MIM capacitor). The selector transistor 408 may be coupled to the capacitor 410 at a storage node 412 (e.g., by a via).

The memory array 402 may further include word lines 414 and bit lines 416. FIG. 4 illustrates two memory cells 404 that are coupled to the same bit line 416 and different word lines 414. It will be apparent that the memory array 402 may include additional bit lines 416 and word lines 414, as well as additional memory cells 404. Each memory cell 404 may be coupled to a unique combination of word line 414 and bit line 416.

The gate terminal of the selector transistor 408 may be coupled to the respective word line 414. The word lines 414 may be coupled to respective word line drivers 418 of the control circuit 406 (e.g., by respective vias 420). The word line drivers 418 may include transistors in the logic layer of the 3D IC 400, as shown. In some embodiments, the vias 420 may couple the word lines 414 to the respective word line drivers 418 through the back side of the logic layer. For example, the vias 420 may couple the word lines 414 to the diffusion region (e.g., source or drain region) of a transistor of the driver 418 through the back side of the logic layer.

In various embodiments, the bit line 416 may be coupled to transistors of a sense amplifier 422 of the control circuit 406 (e.g., via a conductive path 424). The sense amplifier 422 may be included in a "column circuit" of the control circuit 406 (e.g., including the reference path to provide the reference signal used by the sense amplifier 422 to determine the value of the data being read). The memory circuit 401 may include a sense amplifier 422 coupled to each bit line 416.

In some embodiments, the memory array 402 may further include a capacitor top plate 426. Capacitor top plate 426 may be coupled to the top plate (e.g., the plate opposite the plate that is coupled to the storage node 412) of individual capacitors 410 in memory array 402. The capacitor top plate 426 may be conductively coupled to a plate bias circuit 428 (e.g., by a conductive path 430) that includes one or more transistors in the logic layer. The plate bias circuit 428 may provide a bias voltage to the capacitor top plate 426.

Note that some elements of the 3D IC 400 are shown in FIG. 4 for illustration purposes, even though they are located at different cross-sectional depths in the 3D IC 400. For example, the bit line 416 and storage node 412 may be in the same plane but at different depths (e.g., in metal layer M-2). Additionally, plate bias circuit 428 and/or conductive path 430 may be at a different depth than the sense amplifier 422 and/or conductive path 424.

Figure 4B:
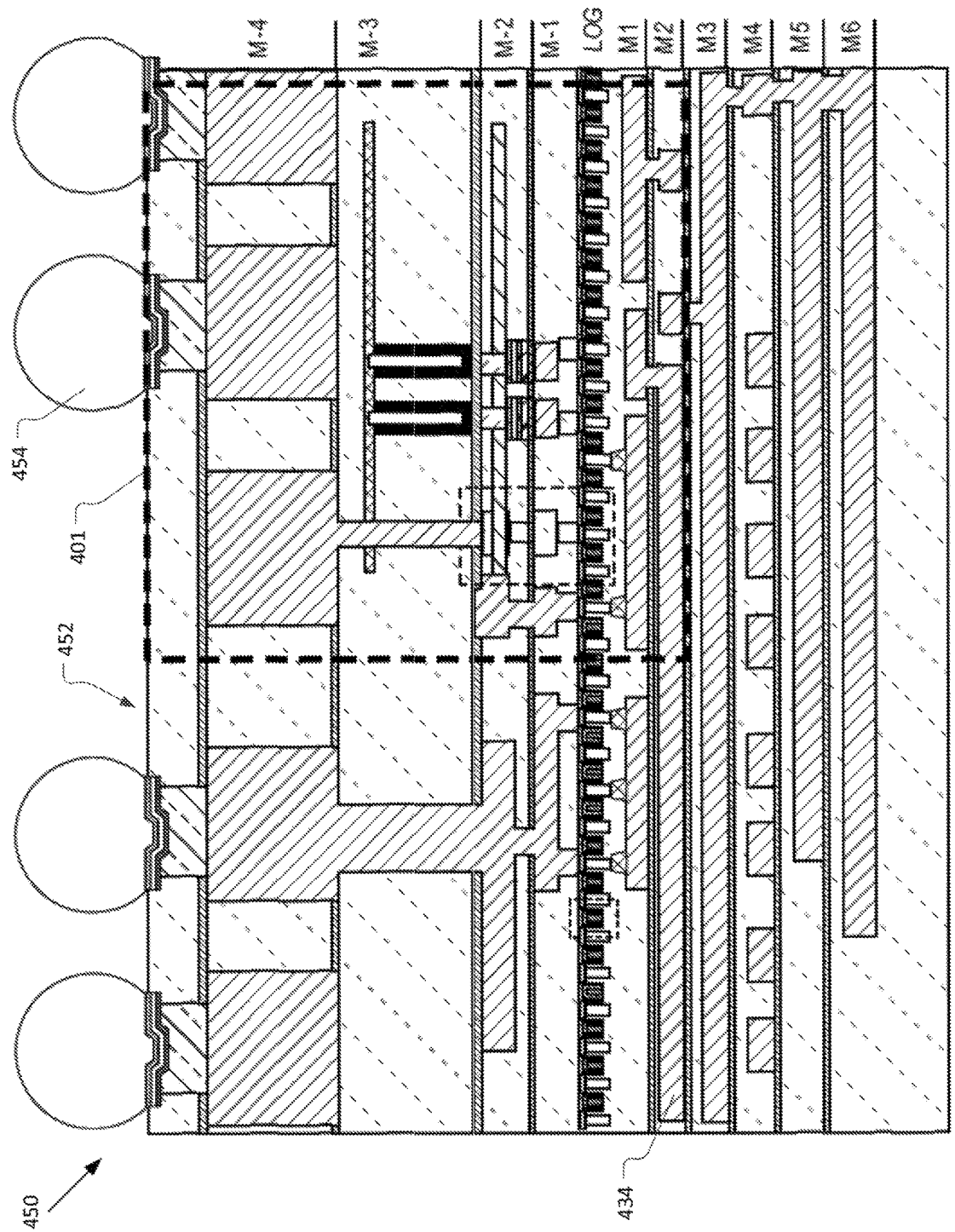
FIG. 4B is a side cross-sectional view of a 3D IC including the memory circuit of FIG. 4A coupled to a processor core.
Figure 5:
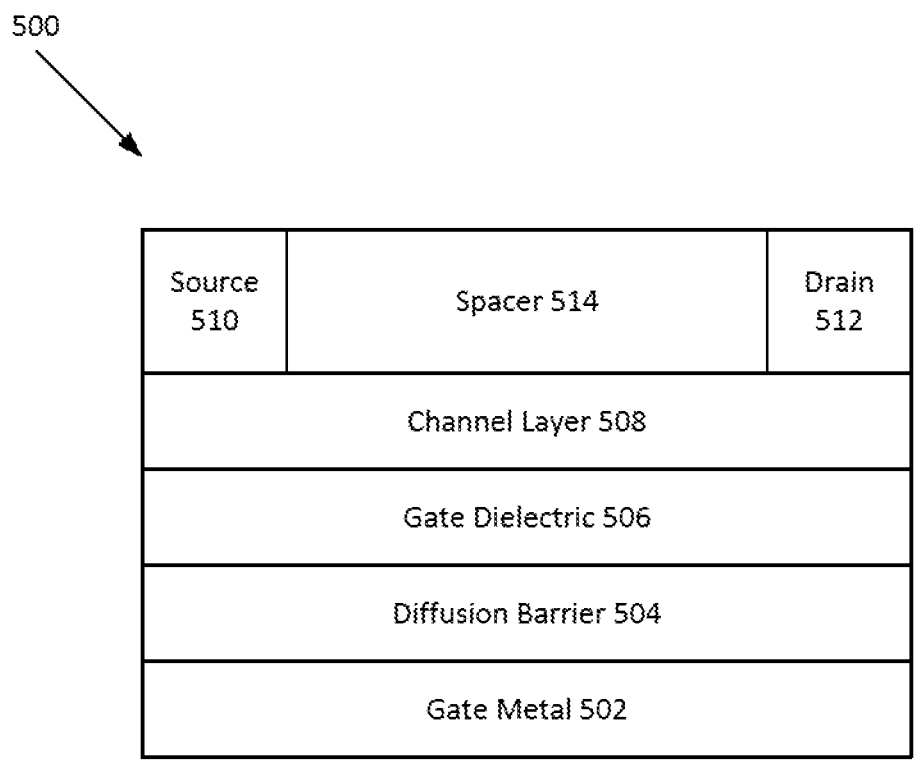
FIG. 5 schematically illustrates a selector transistor that may be included in a memory cell, in accordance with various embodiments.

To illustrate, FIG. 5 shows a side cross-sectional view of a selector TFT 500 that may correspond to the selector transistors 408 in accordance with some embodiments. The cross-sectional view of the selector TFT 500 is orthogonal to the cross-sectional view shown in FIG. 4.

The selector TFT 500 may include a gate stack including one or more layers, such as a gate metal 502, a diffusion barrier 504, and/or a gate dielectric 506, as shown. The gate stack may include more or less layers in other embodiments. The gate metal 502 and diffusion barrier 504 may be collectively referred to as the gate electrode. The gate metal 502 may be coupled to a word line of the memory array. In some embodiments, one or more layers of the gate electrode (e.g., the gate metal 502) may form the word line. For example, the TFT 500 may share one or more layers of the gate electrode (e.g., the gate metal 502) with other TFTs 500 that are associated with the same word line. In other embodiments, the word line may be a separate structure from the gate electrode of the selector TFT 500.

The gate dielectric 506 may include any suitable material, such as silicon and nitrogen (e.g., SiN); hafnium and oxygen (e.g., $HfO_2$); aluminum and oxygen (e.g., $Al_2O_3$); silicon and oxygen (e.g., $SiO_2$); aluminum and nitrogen (e.g., AlN); silicon, oxygen, and nitrogen (e.g., SiON); yttrium and oxygen (e.g., $Y_2O_3$); tantalum and oxygen (e.g., $Ta_2O_5$); and/or titanium and oxygen (e.g., $TiO_2$). The diffusion barrier layer 504 may include any suitable material, such as titanium and nitrogen (e.g., TiN); tantalum; tantalum and nitrogen (TaN); titanium, zirconium, and nitrogen (e.g., $Ti_xZr_{1-x}N$); titanium and/or tungsten (e.g., TiW), etc. The gate metal 502 may include any suitable conductive material, such as one or more metals, including but not limited to, copper, silver, gold, aluminum, cadmium, tungsten, manganese, tantalum, titanium nitride, tantalum nitride, etc.

In various embodiments, the TFT 500 may further include a channel layer (e.g., thin film channel) 508 formed over (e.g., on) the gate dielectric 506. A source electrode 510 and a drain electrode 512 may be formed over (e.g., on) the channel 508. In some embodiments, a spacer 514 may be formed over (e.g., on) the channel 308 between the source electrode 310 and the drain electrode 312. It will be apparent that other embodiments of the TFT 500 may include additional component layers and/or a different configuration than is depicted in FIG. 5.

In various embodiments, the drain electrode 512 may be coupled to the bit line (e.g., bit line 416) and the source electrode 510 may be coupled to the storage node (e.g., storage node 412). In some embodiments, one or more layers of the drain electrode 512 may form the bit line. For example, the TFT 500 may share one or more layers of the drain electrode 512 with other TFTs 500 that are associated with the same bit line. In other embodiments, the bit line may be a separate structure from the drain electrode 512 of the selector TFT 500.

In various embodiments, the channel layer 508 may include a semiconductor material, such as such as zinc and oxygen (e.g., ZnO); indium and oxygen (e.g., $InO_x$ with x from 0.5 to 2); indium, zinc, and oxygen (e.g., IZnO); indium, tin, and oxygen (e.g., ISnO (also referred to as ITO)); aluminum, zinc, and oxygen (e.g., aluminum-doped zinc oxide (AZO)), indium, zinc, and oxygen (e.g., IZO); indium, gallium, zinc, and oxygen (IGZO); gallium, zinc, and oxygen (e.g., GZO); gallium and oxygen (e.g., GO); gallium and nitrogen (e.g., gallium nitride); tin and oxygen (e.g., SnO); cobalt and oxygen (e.g., CoO); nickel and oxygen (e.g., NiO); copper and oxygen (e.g., CuO and/or $Cu_2O$); titanium and oxygen (e.g., $TiO_x$ with x from 0.5 to 2); amorphous silicon; amorphous germanium; poly silicon; poly germanium; poly germanium doped with boron; poly germanium doped with aluminum; poly germanium doped with phosphorous; poly germanium doped with arsenic; tungsten disulphide; molybdenum disulphide; molybdenum selenide; black phosphorus; indium antimonide; graphene; graphyne; borophene; germanene; silicene; $Si_2BN$; stanene; phosphorene; molybdenite; poly-III-V material such as InAs, InGaAs, or InP; amorphous InGaZnO (a-IGZO); crystal-like InGaZnO (c-IGZO); GaZnON; ZnON; and/or C-Axis Aligned Crystal (CAAC).

Referring again to FIG. 4, the word line 414 may be formed in back-side metal layer M-1 (e.g., the metal layer closest to the logic layer). The selector TFT 408, storage node 412, and/or bit line 416 of the individual memory cells 404 may be in back-side metal layer M-2. For example, the selector TFT 408 may be in a first portion (e.g., via portion) of the back-side metal layer M-2 that is closer to the logic layer, and the storage node 412 and/or bit line 416 may be in a second portion (e.g., trench portion) of the back-side metal layer M-2. The capacitor 410 may be in back-side metal layers M-3 and/or M-4. For example, in some embodiments, the capacitor may include an MIM capacitor plate 410 in the back-side metal layer M-3 and a top plate 426 in the back-side metal layer M-4.

In various embodiments, one or more of the front-side metal layers of the 3D IC 400 may include local and/or global interconnects and/or other devices for the control circuit 406. For example, a local interconnect 432 (e.g., in front-side metal layer M1) may be coupled to the sense amplifier 422 and to an output driver of memory array 402 to output the data read from the memory array 402). A global interconnect 434 (e.g., in front-side metal layer M2) may couple the control circuit 406 to one or more other circuits on the 3D IC (e.g., to the adjacent CPU core where the memory data is used for computation in the logic layer).

FIG. 4B illustrates a 3D IC 450 that includes the memory circuit 401 and a processor core 452. The processor core 452 includes other transistors in the logic layer. The global interconnect 434 conductively couples the memory circuit 401 to the processor core 452. Accordingly, the processor core 452 may initiate memory commands, for example, to write data to or read data from the memory circuit 401. In some embodiments, the memory circuit 401 may provide a cache memory (e.g., working memory) for the processor core 452.

In various embodiments, chip-level contacts (e.g., bumps) 454 may be coupled to the back side of the 3D IC 450 to route signals between the 3D IC 450 and another device (e.g., another IC).

In various embodiments, having the memory array of the 3D IC on the back side of the 3D IC 400 and/or 450 may enable the configuration of the front-side metal layers for the processor core 452 to be unaltered. That is, the same configuration of the front-side metal layers for the processor core 452 may be used for ICs that include the processor core 452 and the embedded memory circuit 401, as well as for ICs that include the processor core 452 but do not include the embedded memory circuit 401. This provides advantages for IC design and manufacturing.

Furthermore, the back-side metal layers of the 3D IC 400 and/or 450 may be specifically designed to accommodate the memory array 402 of the memory circuit 401. For example, one or more of the back-side metal layers of the 3D IC 400 and/or 450 may be thicker and/or have a greater pitch than corresponding front-side metal layers of the 3D IC 400 and/or 450.

In various embodiments, the apparatuses described herein (e.g., the memory circuit 100, memory circuit 200, memory circuit 300, 3D IC 400, and/or 3D IC 450) may be formed on a respective dies of a wafer. For example, FIGS. 5 and 6 are top views of a wafer and dies that include one or more voltage regulators, in accordance with any of the embodiments disclosed herein.

Figure 6B:
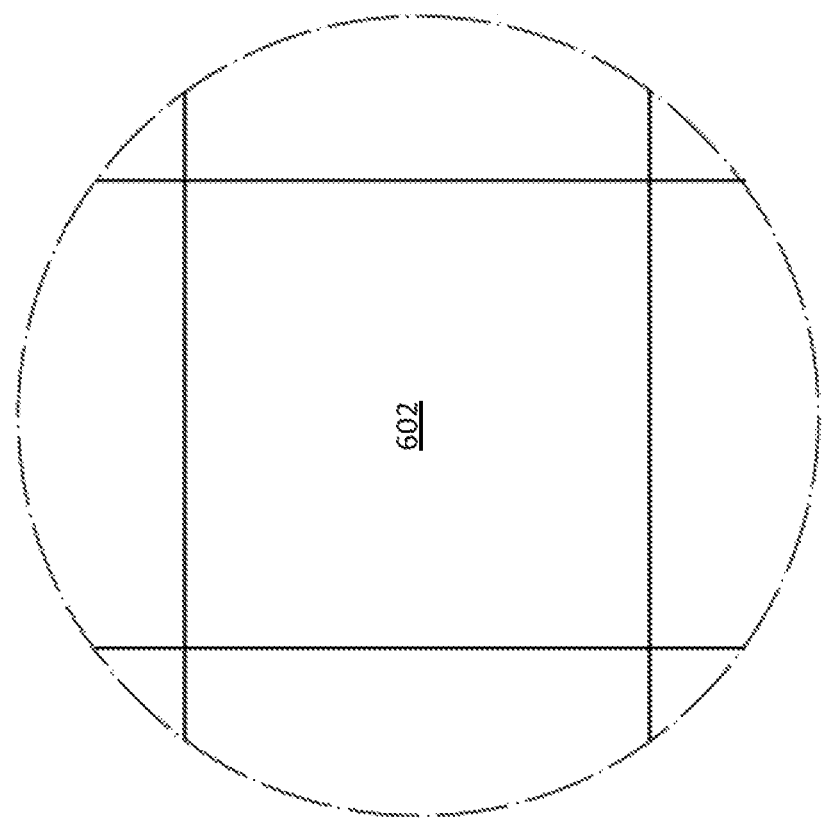
FIGS. 6A and 6B are top views of a wafer and dies that include one or more IC structures in accordance with one or more of the embodiments disclosed herein.
Figure 6A:
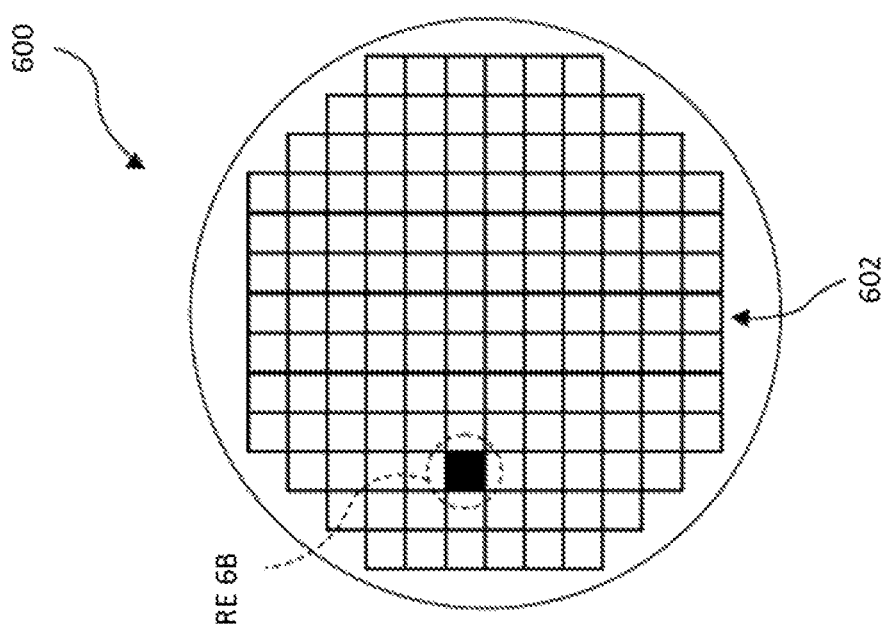

Referring to FIGS. 6A and 6B, a wafer 600 may be composed of semiconductor material and may include one or more dies 602 having IC structures formed on a surface of the wafer 600. Each of the dies 602 may be a repeating unit of a semiconductor product that includes any suitable IC (e.g., memory circuit 100, memory circuit 200, memory circuit 300, 3D IC 400, and/or 3D IC 450). After the fabrication of the semiconductor product is complete, the wafer 600 may undergo a singulation process in which each of the dies 602 is separated from one another to provide discrete "chips" of the semiconductor product. In particular, devices that include one or more IC structures as disclosed herein may take the form of the wafer 600 (e.g., not singulated) or the form of the die 602 (e.g., singulated). The die 602 may include one or more transistors and/or supporting circuitry to route electrical signals to the transistors, as well as any other IC components. In some embodiments, the wafer 600 or the die 602 may include a memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Figure 7:
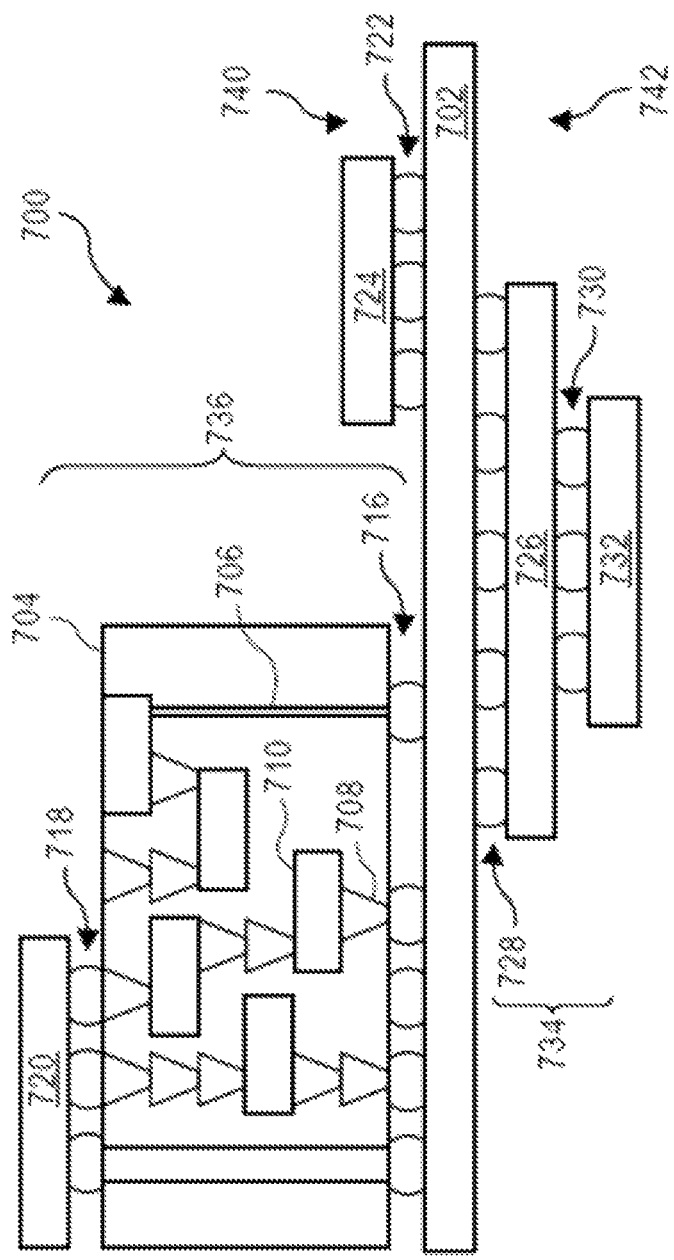
FIG. 7 is a cross-sectional side view of an integrated circuit (IC) device assembly that may include one or more IC structures, in accordance with one or more of the embodiments disclosed herein.

FIG. 7 is a cross-sectional side view of an integrated circuit (IC) device assembly 700 that may include one or more of the apparatuses described herein (e.g., the memory circuit 100, memory circuit 200, memory circuit 300, 3D IC 400, and/or 3D IC 450), in accordance with one or more of the embodiments disclosed herein.

The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include one or more of the apparatuses described herein (e.g., the memory circuit 100, memory circuit 200, memory circuit 300, 3D IC 400, and/or 3D IC 450).

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 6) or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
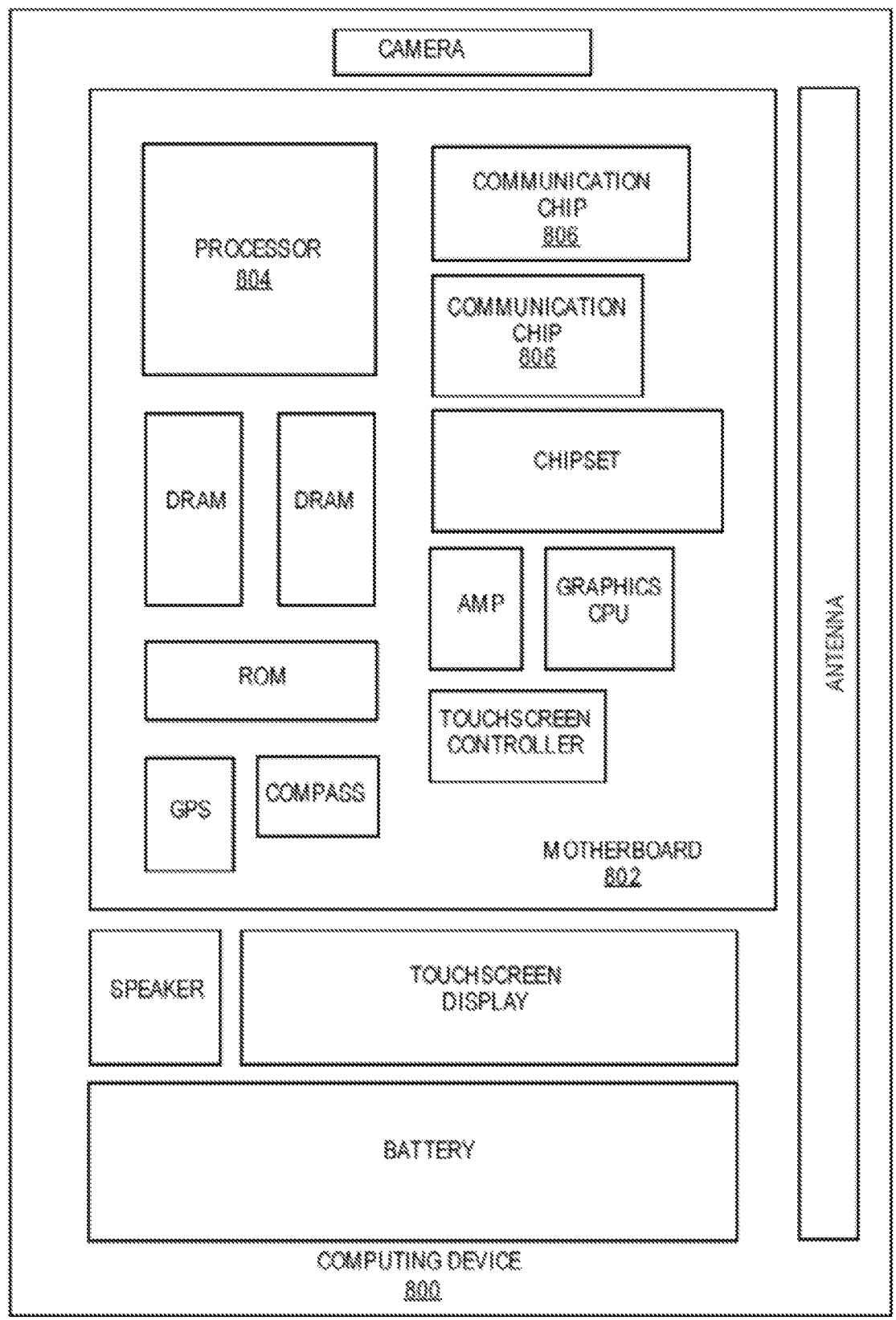
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more of the apparatuses described herein (e.g., memory circuit 100, memory circuit 200, memory circuit 300, 3D IC 400, and/or 3D IC 450), in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more of the apparatuses described herein (e.g., memory circuit 100, memory circuit 200, memory circuit 300, 3D IC 400, and/or 3D IC 450), in accordance with implementations of embodiments of the disclosure.

In further implementations, another component housed within the computing device 800 may contain an integrated circuit die that includes one or more of the apparatuses described herein (e.g., memory circuit 100, memory circuit 200, memory circuit 300, 3D IC 400, and/or 3D IC 450), in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a television, a set-top box, an entertainment control unit, a digital camera, a portable music player, or a digital video recorder. In further implementations, the computing device 800 may be any other electronic device that processes data.

Some non-limiting Examples of various embodiments are provided below.

Example 1 is an integrated circuit (IC) die including: a control circuit including logic transistors in a logic layer of the IC die; and a memory array in back-side metal layers of the IC die, wherein the memory array is coupled to the control circuit to be controlled by the control circuit. The memory array includes: a word line in a first back-side metal layer that is closest to the logic layer; and a memory cell. The memory cell includes: a storage device; and a selector transistor, wherein the selector transistor has a source terminal coupled to the storage device and a gate terminal coupled to the word line, wherein the transistor is at least partially in a second back-side metal layer that is adjacent the first back-side metal layer.

Example 2 is the IC die of Example 1, wherein the storage device is at least partially in a third back-side metal layer that is adjacent the second back-side metal layer and further from the logic layer than the first and second back-side metal layers.

Example 3 is the IC die of Example 2, wherein the storage device is a capacitor.

Example 4 is the IC die of any one of Examples 1 to 3, wherein the control circuit includes a word line driver that includes one or more of the logic transistors coupled to the word line to provide a word line signal to the word line.

Example 5 is the IC die of any one of Examples 1 to 4, wherein the memory array further includes a bit line in the second back-side metal layer, wherein the bit line is coupled to a drain terminal of the selector transistor.

Example 6 is the IC die of Example 5, wherein the control circuit includes a sense amplifier that includes one or more of the logic transistors coupled to the bit line.

Example 7 is the IC die of any one of Examples 1 to 6, wherein the control circuit further includes one or more local interconnects in one or more front-side metal layers of the IC die to route signals between the logic transistors of the control circuit.

Example 8 is the IC die of Example 7, further comprising: a processor core including other logic transistors in the logic layer; and one or more global interconnects in one or more of the front-side metal layers to route signals between the control circuit and the processor core.

Example 9 is a method comprising: forming a control circuit including a plurality of logic transistors in a logic layer of an integrated circuit (IC) die, the control circuit to control a memory array; forming a word line of the memory array in a first back-side metal layer that is closest to the logic layer; and forming a memory cell of the memory array. The forming the memory cell includes: forming a selector thin-film transistor (TFT) at least partially in a second back-side metal layer that is adjacent the first back-side metal layer, wherein a gate terminal of the selector TFT is coupled to the word line; and forming a capacitor at least partially in a third back-side metal layer that is adjacent the second back-side metal layer and further from the logic layer than the first and second back-side metal layers, wherein the capacitor is coupled to a source terminal of the selector TFT at a storage node of the memory cell.

Example 10 is the method of Example 9, wherein forming the control circuit includes forming a word line driver that includes one or more of the logic transistors coupled to the word line to provide a word line signal to the word line.

Example 11 is the method of Example 9 or Example 10, further comprising forming a bit line of the memory array in the second back-side metal layer, wherein the bit line is coupled to a drain terminal of the selector transistor.

Example 12 is the method of Example 11, wherein forming the control circuit includes forming a sense amplifier that includes one or more of the logic transistors coupled to the bit line.

Example 13 is the method of any one of Examples 9 to 12, further comprising forming one or more local interconnects in a first front-side metal layer that is closest to the logic layer, the one or more local interconnects to route signals between the logic transistors of the control circuit.

Example 14 is the method of Example 13, further comprising: forming a processor core including other logic transistors of the logic layer; and forming one or more global interconnects in a second front-side metal layer that is adjacent the first front-side metal layer, the one or more global interconnects to route signals between the control circuit and the processor core.

Example 15 is a computer system comprising: a circuit board; and an integrated circuit (IC) die coupled to the circuit board. The IC die includes: a processor including a first plurality of logic transistors in a logic layer of the IC die; and an embedded dynamic random access memory (eDRAM) coupled to the processor, the eDRAM including: a control circuit including a second plurality of logic transistors in the logic layer of the IC die, and the control circuit further comprising one or more local interconnects in a front-side metal layer of the IC die to route signals between logic transistors of the second plurality of logic transistors; and a memory array in back-side metal layers of the IC die and at least partially below the control circuit, wherein the control circuit is to control the memory array, and wherein the memory array is in the back-side metal layers that are closest to the logic layer.

Example 16 is the computer system of Example 15, wherein the memory array includes: word lines in a first back-side metal layer that is closest to the logic layer; and selector transistors of respective memory cells of the memory array, wherein the selector transistors are at least partially in a second back-side metal layer adjacent the first back-side metal layers.

Example 17 is the computer system of Example 16, wherein the memory array further includes capacitors of the respective memory cells at least partially in a third back-side metal layer that is adjacent the second back-side metal layer.

Example 18 is the computer system of Example 16 or Example 17, wherein the control circuit includes word line drivers that include one or more of the second plurality of logic transistors coupled to the respective word lines to provide a word line signal to the respective word lines.

Example 19 is the computer system of any one of Examples 16 to 18, wherein the memory array further includes bit lines in the second back-side metal layer.

Example 20 is the computer system of Example 19, wherein the control circuit includes sense amplifiers coupled to the respective bit lines, wherein the sense amplifiers include one or more of the second plurality of logic transistors coupled to the bit line.

Example 21 is the computer system of any one of Examples 15 to 20, wherein the IC die further includes one or more global interconnects in one or more of the front-side metal layers to route signals between the control circuit and the processor core.

Example 22 is the computer system of any one of Examples 15 to 21, further comprising one or more of an antenna, a display, a network adapter, or a memory device coupled to the IC die.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. An integrated circuit (IC) die including:
a control circuit including logic transistors in a logic layer of the IC die; and
a memory array in back-side metal layers of the IC die, wherein the memory array is coupled to the control circuit to be controlled by the control circuit, and wherein the memory array includes:
a word line in a first back-side metal layer that is closest to the logic layer; and
a memory cell, wherein the memory cell includes:
a storage device; and
a selector transistor, wherein the selector transistor has a source terminal coupled to the storage device and a gate terminal coupled to the word line, wherein the transistor is at least partially in a second back-side metal layer that is adjacent the first back-side metal layer.

2. The IC die of claim 1, wherein the storage device is at least partially in a third back-side metal layer that is adjacent the second back-side metal layer and further from the logic layer than the first and second back-side metal layers.

3. The IC die of claim 2, wherein the storage device is a capacitor.

4. The IC die of claim 1, wherein the control circuit includes a word line driver that includes one or more of the logic transistors coupled to the word line to provide a word line signal to the word line.

5. The IC die of claim 1, wherein the memory array further includes a bit line in the second back-side metal layer, wherein the bit line is coupled to a drain terminal of the selector transistor.

6. The IC die of claim 5, wherein the control circuit includes a sense amplifier that includes one or more of the logic transistors coupled to the bit line.

7. The IC die of claim 1, wherein the control circuit further includes one or more local interconnects in one or more front-side metal layers of the IC die to route signals between the logic transistors of the control circuit.

8. The IC die of claim 7, further comprising:
a processor core including other logic transistors in the logic layer; and
one or more global interconnects in one or more of the front-side metal layers to route signals between the control circuit and the processor core.

9. A method comprising:
forming a control circuit including a plurality of logic transistors in a logic layer of an integrated circuit (IC) die, the control circuit to control a memory array;
forming a word line of the memory array in a first back-side metal layer that is closest to the logic layer; and
forming a memory cell of the memory array, the forming the memory cell including:
forming a selector thin-film transistor (TFT) at least partially in a second back-side metal layer that is adjacent the first back-side metal layer, wherein a gate terminal of the selector TFT is coupled to the word line; and
forming a capacitor at least partially in a third back-side metal layer that is adjacent the second back-side metal layer and further from the logic layer than the first and second back-side metal layers, wherein the capacitor is coupled to a source terminal of the selector TFT at a storage node of the memory cell.

10. The method of claim 9, wherein forming the control circuit includes forming a word line driver that includes one or more of the logic transistors coupled to the word line to provide a word line signal to the word line.

11. The method of claim 9, further comprising forming a bit line of the memory array in the second back-side metal layer, wherein the bit line is coupled to a drain terminal of the selector transistor.

12. The method of claim 11, wherein forming the control circuit includes forming a sense amplifier that includes one or more of the logic transistors coupled to the bit line.

13. The method of claim 9, further comprising forming one or more local interconnects in a first front-side metal layer that is closest to the logic layer, the one or more local interconnects to route signals between the logic transistors of the control circuit.

14. The method of claim 13, further comprising:
forming a processor core including other logic transistors of the logic layer; and
forming one or more global interconnects in a second front-side metal layer that is adjacent the first front-side metal layer, the one or more global interconnects to route signals between the control circuit and the processor core.

15. A computer system comprising:
a circuit board; and
an integrated circuit (IC) die coupled to the circuit board, wherein the IC die includes:
  a processor including a first plurality of logic transistors in a logic layer of the IC die; and
  an embedded dynamic random access memory (eDRAM) coupled to the processor, the eDRAM including:
    a control circuit including a second plurality of logic transistors in the logic layer of the IC die, and the control circuit further comprising one or more local interconnects in a front-side metal layer of the IC die to route signals between logic transistors of the second plurality of logic transistors; and
    a memory array in back-side metal layers of the IC die and at least partially below the control circuit, wherein the control circuit is to control the memory array, and wherein the memory array is in the back-side metal layers that are closest to the logic layer.

16. The computer system of claim 15, wherein the memory array includes:
word lines in a first back-side metal layer that is closest to the logic layer; and
selector transistors of respective memory cells of the memory array, wherein the selector transistors are at least partially in a second back-side metal layer adjacent the first back-side metal layers.

17. The computer system of claim 16, wherein the memory array further includes capacitors of the respective memory cells at least partially in a third back-side metal layer that is adjacent the second back-side metal layer.

18. The computer system of claim 16, wherein the control circuit includes word line drivers that include one or more of the second plurality of logic transistors coupled to the respective word lines to provide a word line signal to the respective word lines.

19. The computer system of claim 16, wherein the memory array further includes bit lines in the second back-side metal layer.

20. The computer system of claim 19, wherein the control circuit includes sense amplifiers coupled to the respective bit lines, wherein the sense amplifiers include one or more of the second plurality of logic transistors coupled to the bit line.

21. The computer system of claim 15, wherein the IC die further includes one or more global interconnects in one or more of the front-side metal layers to route signals between the control circuit and the processor core.

22. The computer system of claim 15, further comprising one or more of an antenna, a display, a network adapter, or a memory device coupled to the IC die.

* * * * *